(12) United States Patent
Elian et al.

(10) Patent No.: US 9,748,611 B2
(45) Date of Patent: Aug. 29, 2017

(54) APPARATUS FOR DETERMINING A STATE OF A RECHARGEABLE BATTERY OR OF A BATTERY, A RECHARGEABLE BATTERY OR A BATTERY, AND A METHOD FOR DETERMINING A STATE OF A RECHARGEABLE BATTERY OR OF A BATTERY

(71) Applicant: Infineon Technologies AG, Neubiberg (DE)

(72) Inventors: Klaus Elian, Alteglofsheim (DE); Jochen Dangelmaier, Beratzhausen (DE); Manfred Fries, Hunderdorf (DE); Juergen Hoegerl, Regensburg (DE); Georg Meyer-Berg, Munich (DE); Thomas Mueller, Lappersdorf (DE); Guenther Ruhl, Regensburg (DE); Horst Theuss, Wenzenbach (DE); Mathias Vaupel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 264 days.

(21) Appl. No.: 14/311,489

(22) Filed: Jun. 23, 2014

(65) Prior Publication Data
US 2015/0004451 A1    Jan. 1, 2015

(30) Foreign Application Priority Data
Jun. 27, 2013   (DE) ........................ 10 2013 106 740

(51) Int. Cl.
*H01M 10/48* (2006.01)
*G01R 31/36* (2006.01)
*H01M 6/50* (2006.01)

(52) U.S. Cl.
CPC ........ *H01M 10/48* (2013.01); *G01R 31/3689* (2013.01); *H01M 6/505* (2013.01); *H01M 10/488* (2013.01)

(58) Field of Classification Search
None
See application file for complete search history.

(56) References Cited

U.S. PATENT DOCUMENTS

| 5,811,203 | A | 9/1998 | Kono et al. |
| 6,121,755 | A | 9/2000 | Nowak et al. |
| 8,434,940 | B2 | 5/2013 | Lachenmeier et al. |

FOREIGN PATENT DOCUMENTS

| DE | 3402374 A1 | 8/1985 | |
| DE | 102011002841 A1 * | 7/2012 | ............ H02J 7/0091 |

OTHER PUBLICATIONS

Lee, Chang-Chun, Packaging Effect Investigation of CMOS Compatible Pressure Sensor Using Flip Chip and Flex Circuit Board Technologies, Oct. 6, 2004, pp. 48-55, available online at www.sciencedirect.com.

(Continued)

*Primary Examiner* — Daniel Gatewood
(74) *Attorney, Agent, or Firm* — Eschweiler & Associates, LLC

(57) ABSTRACT

An apparatus for determining a state of a rechargeable battery or of a battery has a sensor device and an evaluation device. The sensor device brings about an interaction between an optical signal and a part of the rechargeable battery or of the battery, which part indicates optically acquirable information about a state of the rechargeable battery or of the battery, and detects an optical signal caused by the interaction. The sensor device furthermore provides a detection signal having information about the detected optical signal. The evaluation device determines information about a state of the rechargeable battery or of the battery on (Continued)

the basis of the information of the detection signal. Furthermore, the evaluation device provides a state signal having the information about the determined state.

5 Claims, 11 Drawing Sheets

(56) References Cited

OTHER PUBLICATIONS

Pouch Cell—Small but not Trouble Free—Battery University, pp. 1-3, dated May 13, 2013, as available at http://batteryuniversity.com/learn/article/pouch-cell-small-but-not-trouble-free.

Sensirion, The Sensor Company, Datasheet SHT7x: Humidity and Temperature Sensor IC, 12 pages, Version 5, Dec. 2011.

Solar-Sicherheit.de , Fourth Report of the eCarTec as available with Google Translate at—http://solar-sicherheit.de/2009-ecartec4/. 2 pages.

Zampolli, S. Integration of Gas Sensors in Flexible Circuits: Towards a Flexible Tag Microlab for Food Logistics, 2 pages.

\* cited by examiner

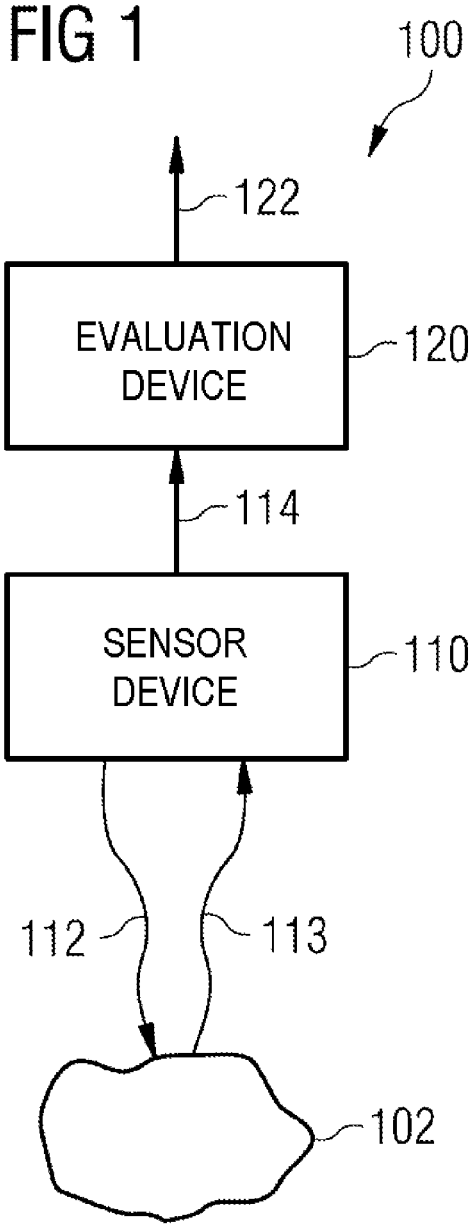

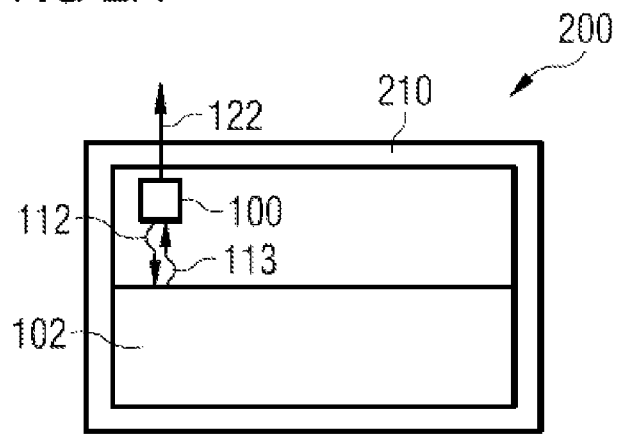
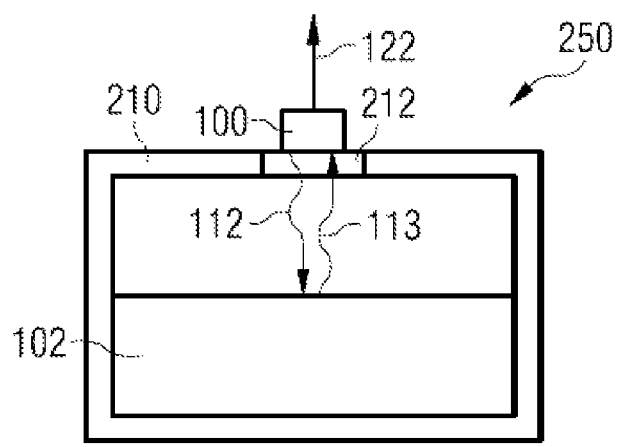

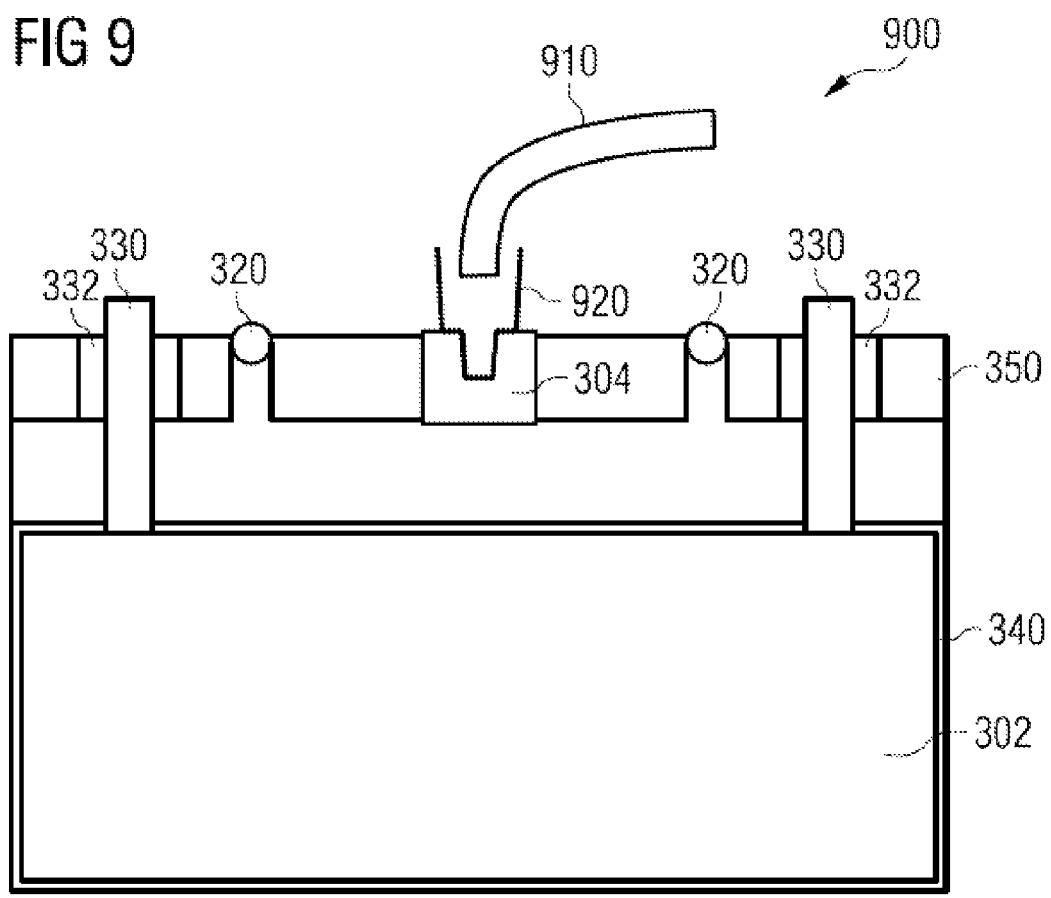

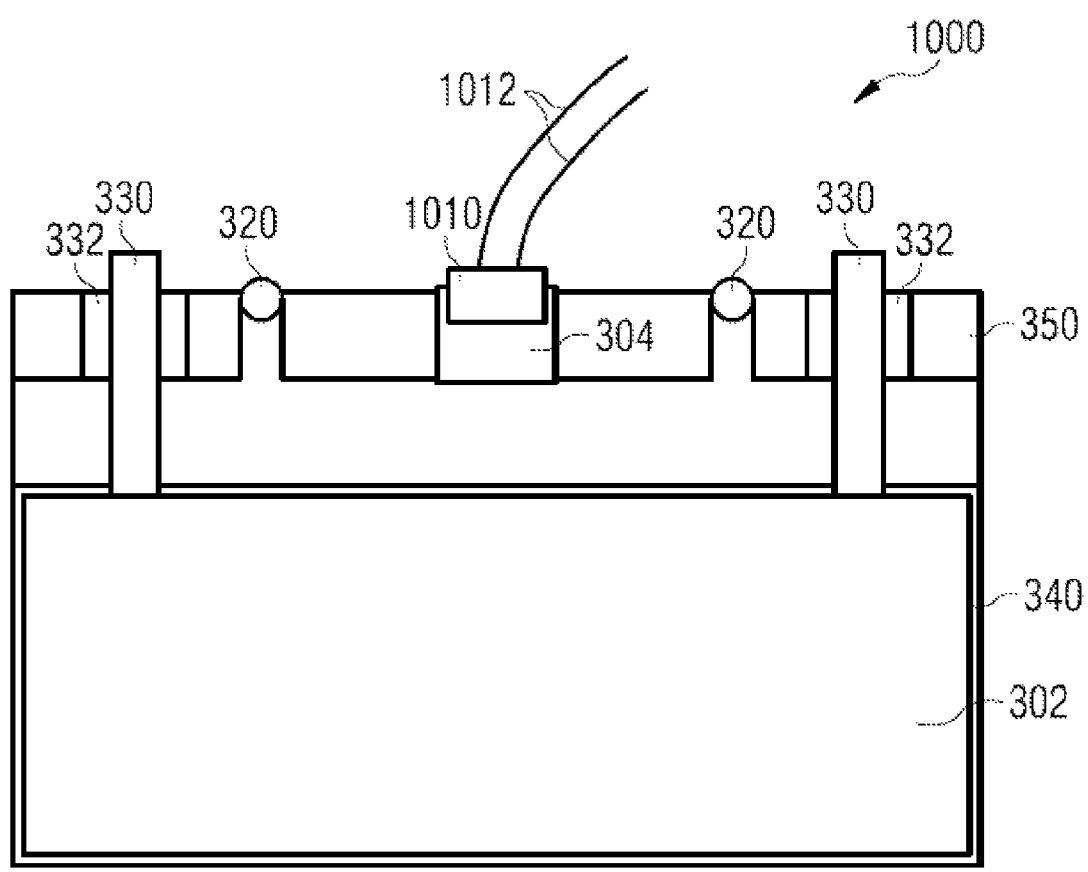

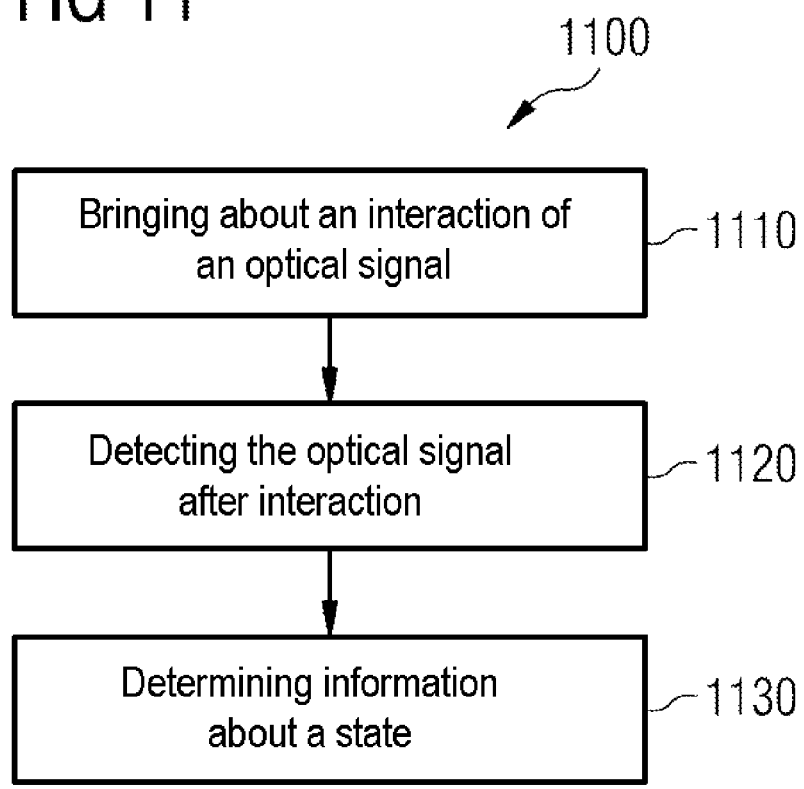

APPARATUS FOR DETERMINING A STATE OF A RECHARGEABLE BATTERY OR OF A BATTERY, A RECHARGEABLE BATTERY OR A BATTERY, AND A METHOD FOR DETERMINING A STATE OF A RECHARGEABLE BATTERY OR OF A BATTERY

REFERENCE TO RELATED APPLICATION

This application claims priority to German application number 10 2013 106 740.9 filed on Jun. 27, 2013.

DESCRIPTION

Example embodiments relate to the field of monitoring states of rechargeable batteries or batteries and, in particular, to an apparatus for determining a state of a rechargeable battery or of a battery, a rechargeable battery or a battery, and a method for determining a state of a rechargeable battery or of a battery.

BACKGROUND

Nowadays, in batteries or rechargeable batteries use is often made of media which can heat up and evaporate upon an increase in temperature as a result of, e.g., local defects in the interior of the electrode stack. As a result, the battery or the rechargeable battery can become distended and burst. As a result of the admittance of oxygen that is then made possible, the organic electrolytes can catch fire and burn away the battery. There is therefore interest in identifying such a change in the state of the rechargeable battery or of the battery at the earliest possible stage and as reliably as possible.

There is therefore the need to provide a concept for determining a state of a rechargeable battery or of a battery which makes it possible to identify a state or a change in state at an early stage and/or with high reliability.

SUMMARY

This need is accommodated by an apparatus for determining a state of a rechargeable battery or of a battery, a rechargeable battery or a battery, and a method for determining a state of a rechargeable battery or of a battery.

Some example embodiments relate to an apparatus for determining a state of a rechargeable battery or of a battery, which apparatus has a sensor device and an evaluation device. The sensor device is designed to bring about an interaction between an optical signal and a part of the rechargeable battery or of the battery, which part indicates optically acquirable information about a state of the rechargeable battery or of the battery, and to detect an optical signal caused by the interaction. Furthermore, the evaluation device is designed to determine information about a state of the rechargeable battery or of the battery on the basis of the information of the detection signal and to provide a state signal having the information about the determined state.

As a result of the optical monitoring of the part (e.g., electrolyte or liquid of the rechargeable battery or of the battery) that indicates a state or a change in the state of the rechargeable battery or of the battery, an alteration can be ascertained at an early stage. Furthermore, as a result of the optical monitoring, direct contact with the state-indicating part of the rechargeable battery or of the battery is not necessary, with the result that the state can be ascertained with high reliability over a long time.

Some example embodiments relate to a battery or a rechargeable battery having a housing and an apparatus for determining a state of the rechargeable battery or of the battery according to the concept described. The housing is designed to enclose a chemical reaction space of the rechargeable battery or of the battery. The apparatus for determining the state of the rechargeable battery or of the battery is arranged at least partly within or at least partly outside the housing of the rechargeable battery or of the battery, such that it is possible to bring about an interaction between the optical signal and the state-indicating part of the rechargeable battery or of the battery and the optical signal after the interaction is detectable.

The arrangement of an optical sensor in proximity to a state-indicating part of a rechargeable battery or of a battery makes it possible to provide a rechargeable battery or a battery having state identification, the state of which can be identified at an early stage and/or with high reliability.

In some example embodiments, the apparatus for determining the state of the rechargeable battery or of the battery is arranged completely outside the housing of the rechargeable battery or of the battery. The housing has a part that is at least partly transparent at least in a wavelength range of the optical signal. Furthermore, the sensor device is designed to bring about an interaction between the optical signal and the state-indicating part of the rechargeable battery or of the battery through the at least partly transparent part and to detect the optical signal after interaction with the state-indicating part of the rechargeable battery or of the battery through the at least partly transparent part.

The integration of an at least partly transparent part into the housing of the rechargeable battery or of the battery makes it possible for the apparatus for determining the state to be arranged outside the housing, such that the apparatus for determining the state is protected from the harsh environment in the interior of the housing (e.g., chemically reactive atmosphere).

BRIEF DESCRIPTION OF THE DRAWINGS

Example embodiments of the present disclosure are explained in greater detail below with reference to the accompanying figures, in which:

FIG. 1 shows a block diagram of an apparatus for determining a state of a rechargeable battery or of a battery;

FIGS. 2A, 2B show a schematic illustration of a rechargeable battery or of a battery comprising an apparatus for determining a state;

FIG. 9 shows a schematic illustration of a rechargeable battery or of a battery comprising an interface for an optical fiber;

FIG. 10 shows a schematic illustration of a rechargeable battery or of a battery comprising a sensor device of an apparatus for determining a state; and FIG. 11 shows a flow chart of a method for determining a state of a rechargeable battery or of a battery.

DETAILED DESCRIPTION

Figure 3:
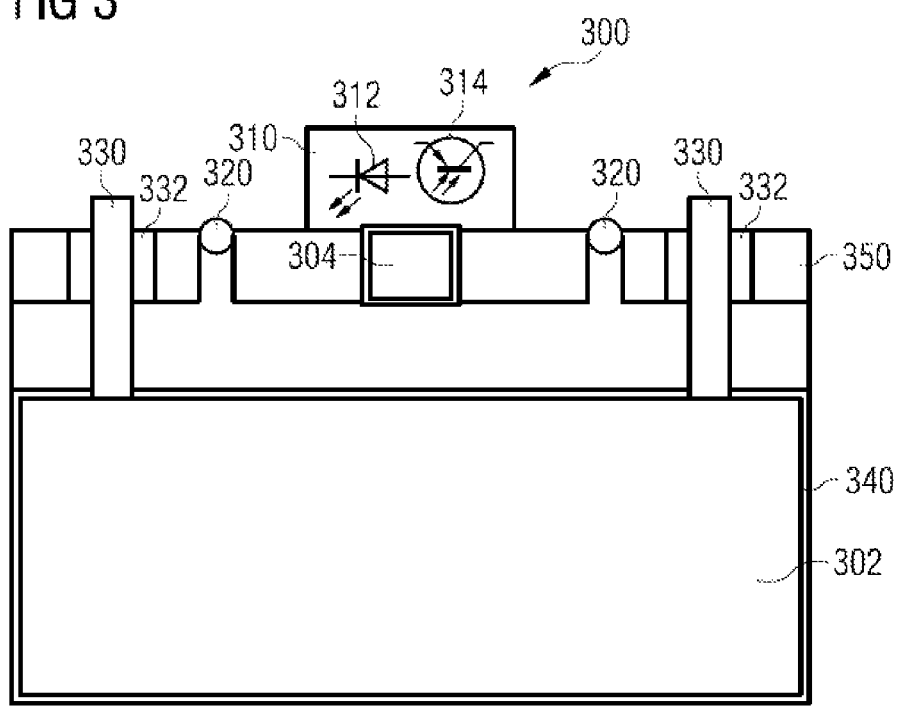
FIG. 3 shows a schematic illustration of a further rechargeable battery or of a battery comprising an apparatus for determining a state.

Various example embodiments will now be described more comprehensively with reference to the accompanying drawings, which illustrate some example embodiments. In the figures, the thickness dimensions of lines, layers and/or regions may be illustrated in an exaggerated fashion for the sake of clarity.

In the following description of the enclosed figures, which merely show some example embodiments by way of example, identical reference signs may designate identical or comparable components. Furthermore, combinatory reference signs can be used for components and objects which occur multiply in an example embodiment or in a drawing, but are described jointly with regard to one or more features. With regard to individual, a plurality or all of the features, for example their dimensionings, components or objects which are described with identical or combinatory reference signs can be embodied identically, but if appropriate also differently, unless explicitly or implicitly revealed otherwise by the description.

Although example embodiments can be modified and altered in various ways, example embodiments are illustrated as examples in the figures and are described comprehensively herein. It should be clarified, however, that there is no intention to restrict example embodiments to the forms respectively disclosed, rather that example embodiments are intended to cover all functional and/or structural modifications, equivalents and alternatives which lie within the scope of the disclosure. Identical reference signs designate identical or similar elements in the entire description of the figures.

It is noted that one element designated as "connected" or "coupled" to another element can be directly connected or coupled to the other element or that intervening elements can be present. By contrast, if one element is designated as "directly connected" or "directly coupled" to another element, no intervening elements are present. Other terms used to describe the relationship between elements should be interpreted in a similar way ("e.g., between" vis-à-vis "directly therebetween", "adjacent" vis-à-vis "directly adjacent", etc.).

The terminology used herein serves only to describe specific example embodiments and is not intended to restrict the example embodiments. As used herein, the singular forms "a" and "the" are also intended to include the plural forms, unless clearly indicated otherwise by the context. Furthermore, it should be clarified that the expressions such as e.g., "comprises", "comprising", "has" and/or "having", as used herein, indicate the presence of stated features, whole numbers, steps, work sequences, elements and/or components, but do not rule out the presence or the addition of one or more features, whole numbers, steps, work sequences, elements, components and/or groups thereof.

Unless defined otherwise, all terms used herein (including technical and scientific terms) have the same meaning which is ascribed to them by a person of average skill in the art in the field to which the example embodiments belong. Furthermore, it should be clarified that expressions, e.g., those defined in generally used dictionaries, should be interpreted as if they had the meaning which is consistent with their meaning in the context of the relevant art, and should not be interpreted in an idealized or excessively formal sense, as long as this is not expressly defined herein.

Hereinafter, the term battery is used, inter alia, both for non-rechargeable primary cells and for rechargeable secondary cells or rechargeable batteries, as has become customary in the meantime in general linguistic usage. Generally, the concept described and the example embodiments described are applicable both to non-rechargeable batteries and to rechargeable batteries.

FIG. 1 shows a block diagram of an apparatus 100 for determining a state of a rechargeable battery or of a battery as one example embodiment. The apparatus 100 comprises a sensor device 110 and an evaluation device 120. The sensor device 110 generates an optical signal and brings about an interaction between the optical signal and a part of the rechargeable battery or of the battery, which part indicates optically acquirable information about a state of the rechargeable battery or of the battery. Furthermore, the sensor device 110 detects an optical signal 113 caused by the interaction. In addition, the sensor device 110 provides a detection signal 114 having information about the detected optical signal 113. The evaluation device 120 determines information about a state of the rechargeable battery or of the battery on the basis of the information of the detection signal 114 and provides a state signal 122 having the information about the determined state.

As a result of the optical monitoring of the part (e.g., electrolyte or liquid of the rechargeable battery or of the battery) that indicates a state or a change in the state of the rechargeable battery or of the battery, an alteration can be ascertained at an early stage. Furthermore, as a result of the optical monitoring, direct contact with the state-indicating part of the rechargeable battery or of the battery is not necessary, with the result that the state can be ascertained with high reliability over a long time.

The state to be determined by the apparatus 100 can be an arbitrary optically acquirable state. By way of example, this can be a pressure, a pressure increase, a temperature or a temperature change in the interior of the battery or of the rechargeable battery which causes or exhibits as an accompanying phenomenon an optical alteration of a liquid (e.g., of the battery chemicals or of the electrolyte) or results in a deformation of a part of the battery or of the rechargeable battery (e.g., a membrane). The determined state can then be an alteration of the observed state-indicating part 102 or else a state derived therefrom (e.g., pressure in the interior exceeds a critical value).

Furthermore, the apparatus 100 can be used for use in a wide variety of rechargeable batteries or batteries (e.g., lithium-ion rechargeable battery, lead-acid rechargeable battery, alkali-manganese batteries, zinc-carbon batteries or lithium batteries).

The sensor device 110 can be arranged at least partly or completely within or at least partly or completely outside a housing of the rechargeable battery or of the battery.

The optical signal 112 can be a light beam or a light pulse, for example, which is oriented toward the state-indicating part 102 of the rechargeable battery or of the battery, such that the optical signal 112 can interact with the state-indicating part 102. In this case, the optical signal 112 can have an arbitrary wavelength or components in different wavelength ranges. By way of example, the optical signal 112 can have a wavelength in a wavelength range in which the optical signal 112 interacts as strongly as possible with the state-indicating part 102, such that the optical signal 113 after the interaction experiences a more distinct alteration depending on the state of the state-indicating part 102.

An interaction with the state-indicating part 102 can take place for example by means of a complete, partial or wavelength-dependent reflection or a wavelength-dependent absorption of parts of the optical signal 112 or by means of an excitation of a luminescence radiation (e.g., fluorescence or phosphorescence).

Depending on the type of interaction, the optical signal 113 caused by the interaction can be, for example, the reflected optical signal, a reflected part of the optical signal, a non-absorbed part of the optical signal or a luminescence radiation excited by the optical signal 112.

The sensor device 110 can then detect the optical signal 113 caused by the interaction. The detection can be, depending on the type of interaction and of the state-indicating part 102, for example, an acquisition of the intensity or of the light intensity of the optical signal 113 caused by the interaction, a wavelength-dependent acquisition of the intensity or light intensity of the optical signal 113 caused by the interaction, an angle of incidence of the optical signal 113 caused by the interaction, or a one- or two-dimensional frequency-independent or frequency-dependent acquisition of the intensity or light intensity of the optical signal 113 caused by the interaction. The information about the detected optical signal (e.g., the frequency-dependent intensity of the optical signal caused by the interaction) can be provided to the evaluation device 120 in the form of an electrical signal, the detection signal 114.

Optionally, the sensor device 110 can have a light source for generating the optical signal 112. Depending on the application, desired interaction and/or the type of the state-indicating part 102, the light source can generate an optical signal in the wavelength range of infrared light or of visible light (e.g., wavelength of 200 nm to 2 μm or wavelength of 300-800 nm). In other words, the sensor device 110 can have a light source for infrared light (e.g., between 200 nm and 400 nm) or visible light (e.g., between 400 and 700 nm), which light source provides the optical signal 112. The light source can be, for example, a light-emitting diode (LED) or a laser diode.

Furthermore, the sensor device 110 can have an optical detector unit (e.g., photodiodes or phototransistor), which can detect the optical signal 113 caused by the interaction. Furthermore, the detector unit of the sensor device 110 can generate and provide the detection signal 114.

The state-indicating part 102 of the rechargeable battery or of the battery can be represented by a wide variety of parts of the rechargeable battery or of the battery. By way of example, the state-indicating part 102 can be a liquid within the housing of the rechargeable battery or of the battery (e.g., the electrolyte, the liquid battery chemical or the battery fluid) which changes an optical property (e.g., absorption, reflection or transparency), for example, depending on a pressure or temperature within the housing. Similarly, the state-indicating part 102 can also be a gas in a cavity of the housing (e.g., gas in the cavity above the battery fluid) which changes, for example, its absorption properties or transmission properties depending on a pressure or a temperature within the housing. Alternatively, the state-indicating part 102 can also be a membrane, for example, which is deformed by a pressure change within the housing and thus reflects the optical signal 112 in a different direction.

As already mentioned, the apparatus 100 and/or the sensor device 110 can be arranged completely within, partly within, and thus also partly outside, or completely outside a housing of the rechargeable battery or of the battery.

Furthermore, the sensor device 110 can be arranged directly on the housing of the battery or of the rechargeable battery or can be arranged at a distance therefrom and can be connected to the rechargeable battery or the battery by means of an optical fiber. In other words, optionally, as an alternative or in addition to one or more of the aspects mentioned above, the apparatus 100 can have an optical fiber or an optical waveguide. The optical fiber can be connectable or connected to the sensor device 110 and to the rechargeable battery or the battery, such that the optical signal 112 is guidable or is guided via the optical fiber to the state-indicating part 102 of the rechargeable battery or of the battery and the optical signal 113 caused by the interaction is guidable or is guided via the optical fiber to the sensor device 110. As a result, the apparatus 100 and/or the sensor device 110 can be arranged independently of the rechargeable battery or the battery and/or can be produced independently of one another.

Optionally, as an alternative or in addition to one or more of the aspects described above, the evaluation device 120 can be arranged in proximity to the sensor device 110 (e.g., on the housing of the rechargeable battery or of the battery) or else can be produced jointly on the same semiconductor chip. Alternatively, the evaluation device 120 and the sensor device 110 can be produced independently of one another and can also be arranged independently of one another (e.g., the sensor device 110 on a housing of the rechargeable battery or of the battery and the evaluation device 120 at the location of an electrical apparatus that uses the electrical energy provided by the rechargeable battery or the battery, such as, e.g., as part of an on-board computer of a vehicle) and can be electrically connected to the sensor device 110.

Furthermore, the evaluation device 120 can optionally be used to monitor a plurality of rechargeable batteries or batteries. By way of example, the apparatus 100 can optionally have a plurality of sensor devices 110 for a plurality of rechargeable batteries or batteries. The evaluation device 120 can then receive a detection signal 114 from each sensor device 110 of the plurality of sensor devices and determine a state of the corresponding rechargeable battery or of the corresponding battery on the basis of the respective detection signal 114. As a result, it can suffice to provide one evaluation device 112 for monitoring a plurality of rechargeable batteries or batteries.

The state signal 124 can be used by the evaluation device 120 or a downstream monitoring device, for example, to implement an emergency shutdown or other measures (e.g., in order to prevent a fire) in the event of an undesired state being ascertained (e.g., a critical pressure or a critical temperature being exceeded).

By way of example, an optical battery sensor can be implemented on the basis of the concept described.

Some example embodiments relate to a rechargeable battery or a battery comprising a housing and an apparatus 100 for determining a state of the rechargeable battery or of the battery according to the concept described above or one or more of the example embodiments mentioned above. In this case, the housing encloses a chemical reaction space of the rechargeable battery or of the battery and the apparatus 100 is arranged at least partly within or at least partly outside the housing (that is to say completely within, partly outside and thus also partly within or completely outside) of the rechargeable battery or the battery, such that an interaction is able to be brought about between the optical signal 112 and the state-indicating part 102 of the rechargeable battery or of the battery and the optical signal 113 caused by the interaction is detectable.

The arrangement of an optical sensor in proximity to a state-indicating part of a rechargeable battery or of a battery makes it possible to provide a rechargeable battery or a battery having state identification, the state of which can be identified at an early stage and/or with high reliability.

A rechargeable battery or a battery stores electrical energy, for example, in the form of chemical energy. The latter can be released as a result of a chemical reaction that takes place within the housing of the battery or of the rechargeable battery. The space in which the parts of the battery that are required for the chemical reaction (e.g., electrode stack and battery fluid or electrolyte) are arranged is designated here as chemical reaction space and is enclosed by the housing in order to close off (e.g., hermetically seal or enclose) the chemical reaction space from the environment.

A part of the apparatus 100 or the entire apparatus 100 is situated within the housing, for example, if the part of the apparatus 100 or the entire apparatus 100 is arranged in the chemical reaction space (that is to say is not separated from the reaction space by the housing), and outside the housing if the part of the apparatus 100 or the entire apparatus 100 is separated from the chemical reaction space by the housing.

FIG. 2A shows a schematic illustration of a rechargeable battery or of a battery 200 in accordance with one example embodiment. The rechargeable battery or the battery 200 comprises a housing 210 and an apparatus 100 for determining the state of the rechargeable battery or of the battery 200, which apparatus is arranged within the housing 210. In this example, both the sensor device and the evaluation device of the apparatus 100 are arranged within the housing 210 and the state signal 122 is guided toward the outside via a bushing in the housing 210. In other words, the apparatus 100 for determining the state of the rechargeable battery or of the battery is arranged within the housing 210 and the evaluation device provides the state signal 122 via a bushing in the housing 210. As a result, direct access to the state-indicating part 102 of the rechargeable battery or of the battery 200 can be made possible for the apparatus 100 and the state can thus be determined at an early stage and/or reliably.

In the example shown in FIG. 2A, the state-indicating part 102 is arranged in the interior of the housing and is, for example, the electrolyte liquid of the rechargeable battery or of the battery 200. The optical signal 112 is at least partly reflected or at least partly absorbed at the surface of the electrolyte or in the liquid (e.g., by a part of an electrode stack that is covered by the liquid), such that a reflected optical signal 113 or an optical signal 113 having non-absorbed portions of the optical signal 112 arises and can be detected by the apparatus 100.

Alternatively, it is also possible, for example, for the sensor device of the apparatus 100 to be arranged within the housing 210 and for the evaluation device of the apparatus 100 to be arranged outside the housing. In other words, the sensor device can be arranged within the housing and can provide the detection signal 114 to the evaluation device outside the housing 210 via a bushing in the housing 210. As a result, direct access to the state-indicating part 102 of the rechargeable battery or of the battery 200 can be made possible for the sensor device and the evaluation device can be protected from the harsh environment within the housing 210.

FIG. 2B shows a schematic illustration of a rechargeable battery or of a battery 250 in accordance with a further example embodiment. The rechargeable battery or the battery 250 has a similar construction to the rechargeable battery or the battery from FIG. 2A, but the apparatus 100 for determining a state of the rechargeable battery or of the battery 250 is arranged outside the housing 210 of the rechargeable battery or of the battery 250. In this case, the housing 210 has a part (e.g., a window or a membrane) that is at least partly transparent (e.g., to the extent of more than 30%, to the extent of more than 50%, to the extent of more than 70% or to the extent of more than 90%) at least in a wavelength range of the optical signal (e.g., a wavelength range lying between 200 nm and 2 µm, between 200 nm and 400 nm, between 300 nm and 2 µm, between 300 nm and 800 nm or between 400 nm and 700 nm wavelength) 112. The sensor device of the apparatus 100 can then be arranged at least partly outside (e.g., a light source or a detector unit of the sensor device) the housing 210 and can bring about an interaction between the optical signal 112 and the state-indicating part 102 (e.g., battery fluid or electrolyte) of the rechargeable battery or of the battery 250 through the at least partly transparent part 212 or can detect the optical signal 113 caused by the interaction through the at least partly transparent part 212 (e.g., if the detector unit lies outside the housing). As a result, depending on the application, parts of the sensor device 110 can be protected from the harsh environmental influences in the interior of the housing 210 or direct access to the state-indicating part 102 can be made possible.

Alternatively, the apparatus 100 for determining the state of the rechargeable battery or of the battery 250 can be arranged completely outside the housing 210, as is indicated in FIG. 2B, for example. The sensor device can then bring about an interaction between the optical signal 112 and the state-indicating part 102 of the rechargeable battery or of the battery through the at least partly transparent part 212 and can detect the optical signal 113 caused by the interaction through the at least partly transparent part 212. As a result, the entire apparatus 100 can be protected from the harsh environmental influences within the housing 210 of the rechargeable battery or of the battery 250.

Besides the direct reflection, absorption or transmission of the optical signal 112, the liquid of the battery as state-indicating part 102 can also have a luminescent constituent (e.g., phosphorescent or fluorescent additives in the liquid of the battery), the luminescence of which can be excited by the optical signal 112. The control unit can then detect the luminescence radiation as the optical signal 113 caused by the interaction. A state or a change of state can then be determined by an alteration (e.g., of the intensity) of the luminescence radiation. In other words, the liquid within the housing 210 of the rechargeable battery or of the battery 200, 250 can have a luminescent constituent. The sensor device can then provide the optical signal 112, such that a luminescence of the luminescent constituent of the liquid is excitable by the optical signal 112. A state of the battery or of the rechargeable battery 200, 250 can thus be determined, for example, very rapidly and/or with high reliability.

FIG. 3 shows a schematic illustration of a rechargeable battery 300 in accordance with one example embodiment. The rechargeable battery 300 has a similar construction to the rechargeable battery or battery shown in FIG. 2B. The sensor device 310 has a light source 312 (e.g., LED) and a detector unit 314 (e.g., phototransistor) arranged outside the housing of the rechargeable battery 300 adjacent to an optical window 304 (e.g., composed of glass or polymer in a metal frame). Via the optical window 304 (at least partly transparent part), the optical signal can be coupled or introduced into the interior of the housing and the optical signal caused by the interaction can be coupled out and detected. In this example, the housing has a container 340 and a cover 350. The container 340 and the cover 350 can be connected to one another in a hermetically sealing fashion, such that the chemical reaction space enclosed by the housing can be hermetically closed off. The cover 350 of the housing has two bushings for electrodes 330 (e.g., copper electrode). The electrodes 330 are introduced into the bushings via seals 332 in order to enable the interior to be hermetically sealed. Furthermore, the cover 350 of the housing has two electrolyte filling openings 320, which are hermetically closable by means of a ball closure, for example. The optical window 304 can be a rupture sheet or replace a rupture sheet, for example.

In this example, the state-indicating part 302 is once again the electrolyte or the battery fluid, as was described with respect to FIGS. 2A and 2B.

Depending on the type of rechargeable battery, a different construction can be present in the chemical reaction space enclosed by the housing of the rechargeable battery 300. By way of example, a wound stack comprising electrodes, active material, a separator, active material and electrodes can be present. The wound stack can be solvent- or conductive-salt-impregnated (e.g., as electrolyte or battery fluid). In other words, the housing can enclose an electrode stack with liquid battery chemicals, for example. The light source 312 and the optical detector 314 can be arranged, for example, above the window 304 in an appropriate housing (package).

A measurement of a battery state or rechargeable battery state through an optical window can be made possible by means of the arrangement shown in FIG. 3.

The light source 312 can be a light source for visible light or infrared light. Correspondingly, the optical window 304 can be, for example, a window (e.g., composed of glass or polymer) that is at least partly transparent to visible light, or a window (e.g., composed of silicon) that is at least partly transparent to infrared light.

Figure 4:
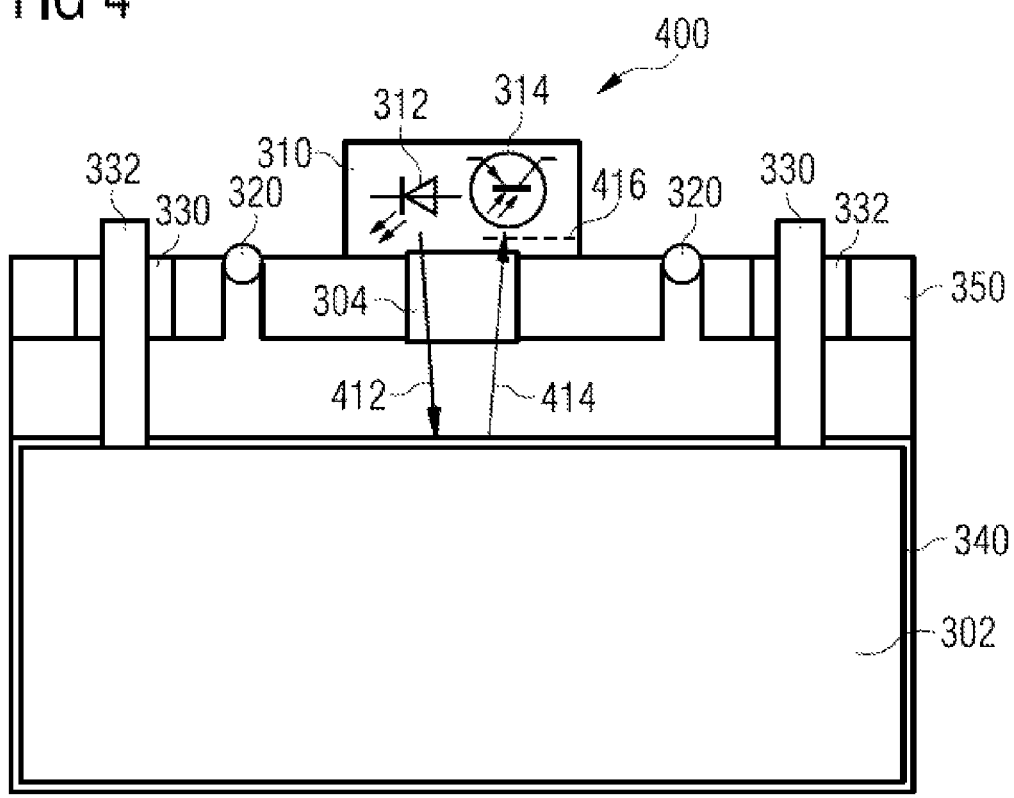
FIG. 4 shows a schematic illustration of a further rechargeable battery or of a battery comprising an apparatus for determining a state.

FIG. 4 shows a schematic illustration of a rechargeable battery 400 corresponding to a further example embodiment. The rechargeable battery 400 has a similar construction to the rechargeable battery shown in FIG. 3. In addition, the sensor device 310 has an optical filter 416 (e.g., silicon-based photonic crystal). The light source 312 generates the optical signal 412 and couples the optical signal 412 into the interior of the housing of the rechargeable battery 400 via the at least partly transparent part 404 (e.g., glass or polymer for visible light or silicon for infrared light), such that the optical signal 412 can interact with the state-indicating part 302 (e.g., electrolyte). Via the same at least partly transparent part 304 of the housing (e.g., of the cover), the optical signal 414 caused by the interaction is filtered by the optical filter 416 (e.g., in a frequency- or wavelength-dependent manner) and is detected by the detector unit 314. In this regard, it is possible, for example, to analyze a variation of characteristic peaks (e.g., bands) in an absorption or emission spectrum of the battery fluid or of the electrolyte as the state-indicating part 302. As a result, a state or a change in the state of the rechargeable battery 400 can be ascertained very rapidly and/or reliably.

Optionally, as an alternative or in addition to one or more of the aspects described above, the state-indicating part of the rechargeable battery or of the battery can be a membrane-like part of the housing. The membrane-like part of the housing can be deformed by a pressure change within the housing to a greater extent than the rest of the housing. In other words, the membrane-like part can have a thickness, an areal extent and/or a material such that the membrane-like part is deformed starting from a pressure determined or definable by these parameters in the interior of the battery or of the rechargeable battery (e.g., before or at least more than the actual housing is deformed at this or higher pressure). As a result, an optical signal directed onto the membrane-like part can be deflected differently by the pressure-dependent deformation and the correspondingly reflected signal can be detected in order to be able to deduce a pressure change as a state of the rechargeable battery or of the battery as a result of a deformation of the membrane-like part. As a result, even a small pressure change can be ascertained if the membrane-like component is deformed.

Figure 5:
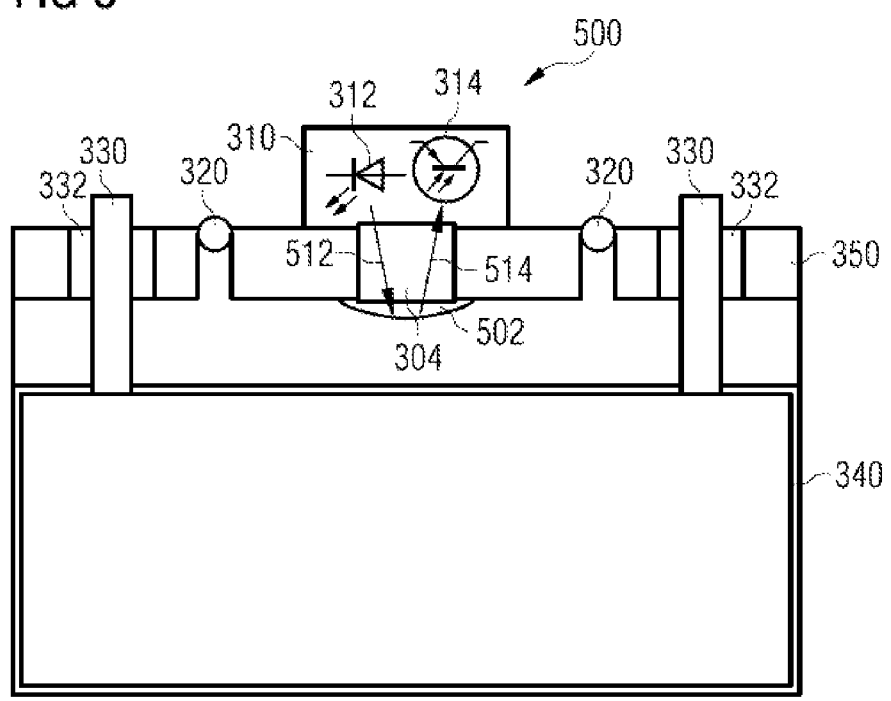
FIG. 5 shows a schematic illustration of a further rechargeable battery or of a battery comprising an apparatus for determining a state.

In a manner matching that, FIG. 5 shows a schematic illustration of a rechargeable battery or of a battery 500 in accordance with one example embodiment. The battery or the rechargeable battery 500 has a similar construction to the rechargeable battery shown in FIG. 3. However, in the case of the rechargeable battery or the battery 500, the state-indicating part 502 is a membrane-like part which is arranged below the at least partly transparent part 304 of the housing (that is to say in the interior of the housing) and is deformed depending on the pressure within the housing. The light source 312 of the sensor device 310 directs an optical signal 512 onto the membrane-like part 502, where it is reflected as a result of the interaction with the membrane-like part 502. The reflected optical signal as optical signal 514 caused by the interaction with the state-indicating part 502 can be detected by the detection unit 314 of the sensor device 310. As a result of the deformation of the membrane-like part 502, the optical signal 512 can be reflected differently (e.g., at different angles), which can be acquired by the detector unit 314. A state of the battery or of the rechargeable battery 500 can be inferred as a result of the acquisition of a pressure change.

In other words, a pressure-sensitive, light-reflecting membrane can be fitted or arranged below the window (in the interior of the housing of the battery or of the rechargeable battery) and a deformation of the membrane can be measured if pressure is generated or the pressure changes in the interior of the housing.

Alternatively, the membrane can also be integrated instead of the at least partly transparent part 304 into the housing or into the cover 350 of the housing, such that the sensor device 310 can direct the optical signal directly onto the membrane-like component 502.

Optionally, as an alternative or in addition to one of the aspects described above, a rechargeable battery or a battery can have a body that is at least partly transparent to the optical signal in the housing. The body that is at least partly transparent to the optical signal can be arranged at a defined distance from the surface of the liquid (e.g., electrolyte or battery fluid) within the housing or can project into the liquid. The sensor device can then couple the optical signal into the body, such that the signal is reflected differently at a surface touching the liquid (e.g., is only partly reflected on account of its angle of incidence) than at a surface of the body not touching the liquid (e.g., complete reflection on account of a small angle of incidence). In other words, the optical signal can be coupled into a transparent body with a shallow angle of incidence (e.g., less than critical angle) with respect to a side surface of the transparent body, such that the optical signal is completely reflected at the surface of the body as long as the surface is situated outside the liquid. If the liquid level changes and the surface dips into the liquid or a larger part of the body dips into the liquid, then a different critical angle for a total reflection at the surface of the body can arise on account of the different density compared with the density of the gas above the liquid, such that only a part or a smaller part of the optical signal is reflected, which can be detected by the sensor device. As a result, it is possible very rapidly and/or reliably to acquire a change in the liquid level within the housing of the rechargeable battery or of the battery and thus to determine a state of the rechargeable battery or of the battery.

Figure 6:
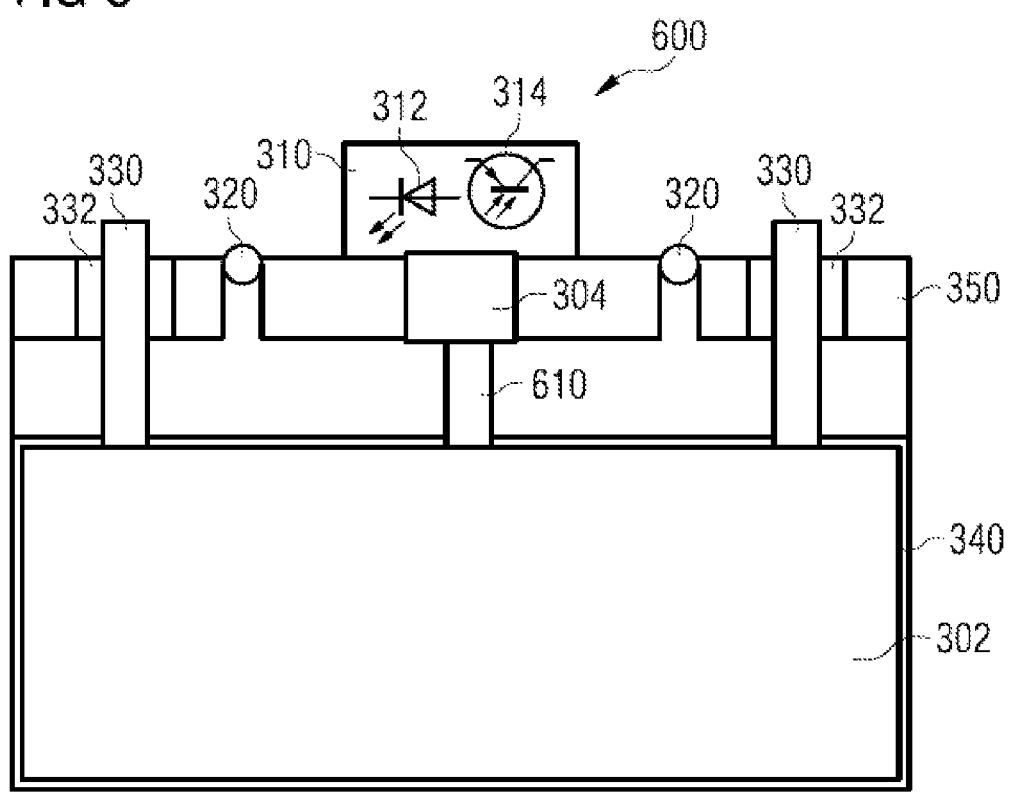
FIG. 6 shows a schematic illustration of a further rechargeable battery or of a battery comprising an apparatus for determining a state.

In a manner matching that, FIG. 6 shows a schematic illustration of a rechargeable battery or of a battery 600 in accordance with one example embodiment. The rechargeable battery or the battery 600 has a similar construction to the rechargeable battery shown in FIG. 3. In addition, a body 610 (e.g., glass rod) that is at least partly transparent to the optical signal is arranged within the housing of the rechargeable battery or of the battery 600. In the example shown, the body 610 that is at least partly transparent to the optical signal extends from the at least partly transparent part 304 of the housing right into the liquid (e.g., electrolyte or battery fluid) of the rechargeable battery or of the battery 600. In this case, the optical signal can be coupled into the body 610 that is at least partly transparent to the optical signal such that it is completely reflected in the region of the gas above the liquid and is only partly reflected at an interface with the liquid. A variation of the liquid level can then be identified from a variation of the reflected optical signal by the detector unit 314. In other words, by way of example, a glass rod can be added and the fluid level can be measured with the aid of light reflections in the glass rod.

Figure 7:
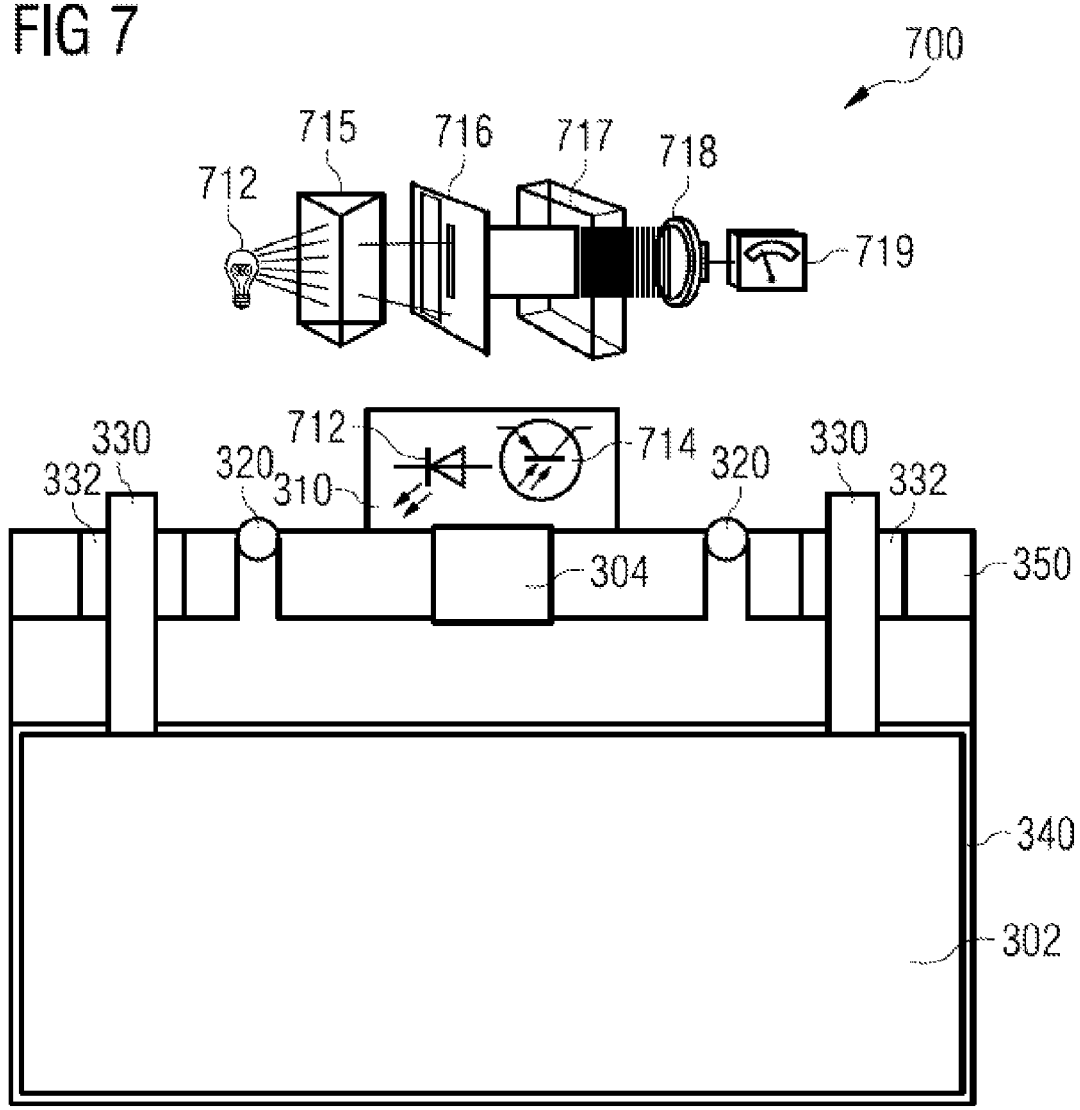
FIG. 7 shows a schematic illustration of a further rechargeable battery or of a battery comprising an apparatus for determining a state.

FIG. 7 shows a schematic illustration of a further rechargeable battery or of a battery 700 in accordance with one example embodiment. The rechargeable battery or the battery 700 is constructed in a similar manner to the rechargeable battery shown in FIG. 3. In this case, the detector unit 714 is constructed as a spectrum analyzer. The spectrum analyzer has, for example, a prism 715, a diaphragm 716, a filter 717, a photoelectron multiplier 718 and an electron counter 719. The light source 712 generates an optical signal and brings about an interaction between the latter and the state-indicating part 302 (e.g., electrolyte or battery fluid). The optical signal caused by the interaction is decomposed into its spectral colors by the prism 715 and the diaphragm 716 forwards only components in a predetermined spectral range to the filter 717. The photoelectron multiplier 718 downstream of the filter 717 then converts the optical signal into a proportional electrical signal and the electron counter 719 can then output an electrical signal proportional to the intensity of the optical signal.

In other words, a spectrum analyzer can be added and an absorption or emission spectrum can be measured with the aid of an optical analysis. A state of the rechargeable battery or of the battery 700 can be determined as a result.

In addition, a body (e.g., glass rod) that is at least partly transparent to the optical signal can optionally also be integrated, as shown in FIG. 6.

Figure 8:
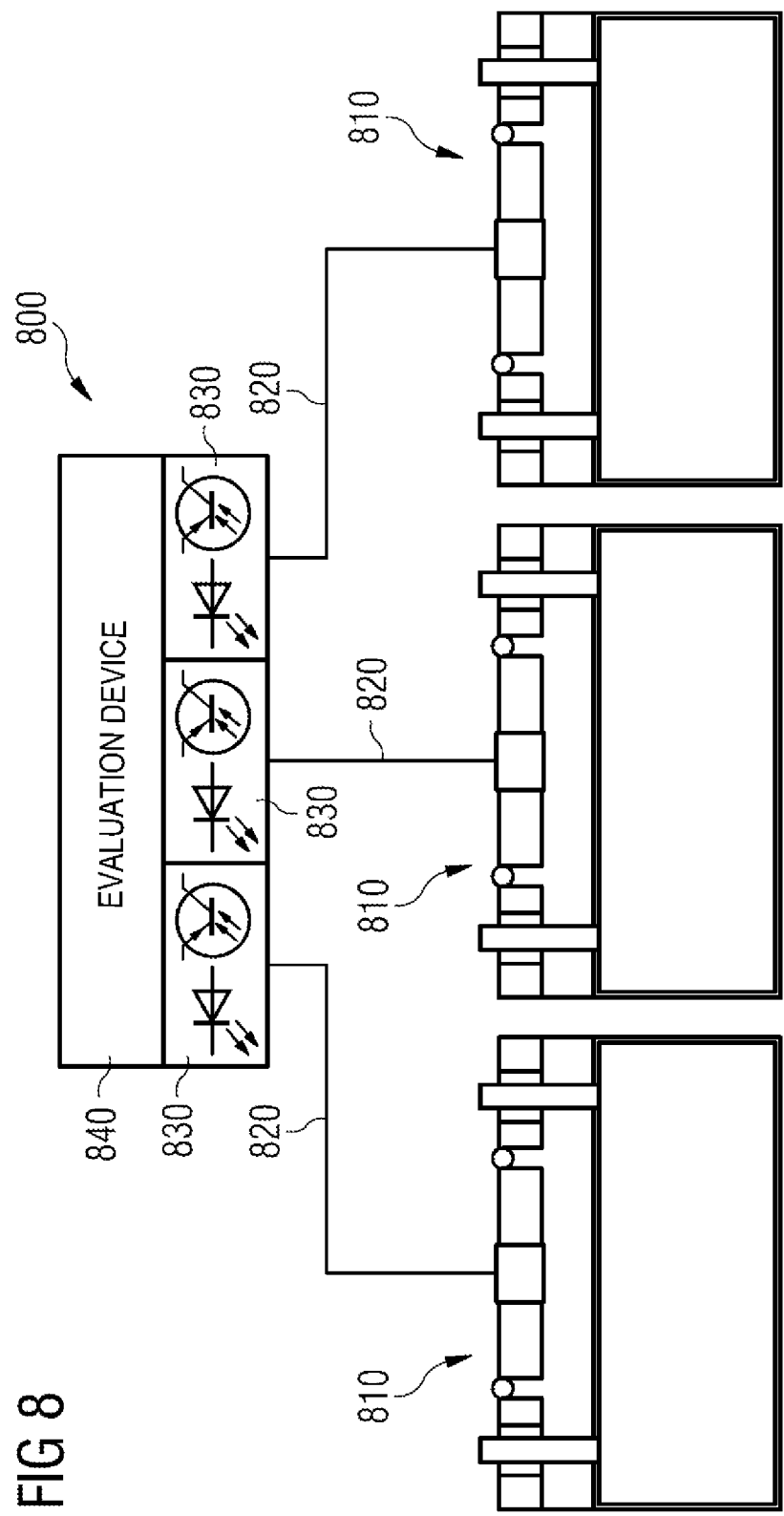
FIG. 8 shows a schematic illustration of a plurality of rechargeable batteries or batteries comprising an apparatus for determining a state of the plurality of rechargeable batteries or batteries.

As already mentioned above, the apparatus 800 for determining a state of a rechargeable battery or of a battery 810 can optionally have a plurality of sensor devices 830 for a plurality of rechargeable batteries or batteries 810, as is shown as an example embodiment in FIG. 8. In this case, the apparatus 800 has an evaluation device 840 (e.g., central microcontroller or on-board computer of a vehicle), which receives detection signals from each sensor device 830 of the plurality of sensor devices (e.g., three sensor devices, as shown, or some other number) and determines a state of the corresponding rechargeable battery or of the corresponding battery 810 on the basis of the respective detection signal. The sensor devices 830 can be arranged directly on the respective battery or the respective rechargeable battery 810 (e.g., as is shown for one battery or one rechargeable battery in FIG. 3) or can be connected to the respective battery or the respective rechargeable battery 810 in each case via an optical fiber 820 (e.g., plastic fiber or glass fiber) in order to introduce the optical signal for the interaction and to detect the optical signal caused by the interaction. In this case, the batteries or the rechargeable batteries 810 can have identical or different constructions (e.g., be constructed as shown in one of FIGS. 3-7). Each of the sensor devices 830 of the plurality of sensor devices 830 can respectively have a light source and a detector unit or the sensor devices 830 can use a common light source and/or a common detector unit (e.g., using time division multiplexing).

By means of such an apparatus 800, a plurality of batteries or rechargeable batteries 810 can be monitored by one apparatus.

By way of example, the use of optical fibers 820 can enable the light transfer to a central analysis unit 840 for a plurality of battery cells 810.

Optionally, as an alternative or in addition to one or more of the aspects described above, it is possible to use an optical fiber 910 for introducing the optical signal and/or for detecting the optical signal caused by the interaction, which optical fiber can be connected to the housing of the battery or of the rechargeable battery 900 via a connection element or a socket 920, as is shown as an example embodiment in FIG. 9. The socket or the connection element 920 can be integrated in the at least partly transparent part 304 of the housing or be fixed thereto, such that the optical fiber 910 can simply be plugged into the socket or the connection element and/or be connected thereto. As a result, it can be ensured in a simple manner that the optical signal can be introduced as desired. In other words, a connection element or a socket 920 can be integrated into the optical window in order to enable a simple fixing or a simple connection for the optical fiber 910.

Alternatively, the socket or the connection element 920 can be integrated as an alternative to the partly transparent part 304 into the housing of the battery or of the rechargeable battery 900, such that the socket or the connection element 920 itself constitutes the at least partly transparent part of the housing. The battery or the rechargeable battery 900 can otherwise have an arbitrary construction (e.g., as shown in one of FIGS. 3-8).

Optionally, as an alternative or in addition to one or more of the aspects described above, the sensor device can be integrated into the housing. In a manner matching that, FIG. 10 shows a schematic illustration of a battery or of a rechargeable battery 1000 in accordance with one example embodiment. The battery or the rechargeable battery 1000 has a similar construction to the rechargeable battery shown in FIG. 3. In this case, however, the sensor device 1010 is integrated into the cover 350 of the housing of the rechargeable battery or of the battery 1000. In the example shown, the sensor device 1010 is connected to the at least partly transparent part 304 in the region of the at least partly transparent part 304 of the housing. The sensor device 1010 (e.g., a fiber-optic transmitting and receiving unit) can provide the detection signal to an evaluation unit via electrical connections 1012. Alternatively, the evaluation unit can be integrated jointly with the sensor device 1010 into the housing of the battery or of the rechargeable battery 1000. As a result, an accurate positioning of the sensor device 1010 can be made possible, such that the state of the rechargeable battery or of the battery 1000 can be determined reliably.

By way of example, a complete optical transmitting and receiving electronic unit can be integrated (e.g., onto or into the optical window) and signals can be provided via an electrical wiring. In other words, a fiber-optic transmitting and receiving unit with electrical contacts and an optical window can be used, for example.

The battery or the rechargeable battery 1000 can furthermore have an arbitrary construction (e.g., as shown in FIGS. 3-9).

Some example embodiments relate to an optical battery sensor. In this case, it is possible to provide a sensor for identifying critical states for example in high-power batteries for electric vehicles. By way of example, a possible arising of excess gas pressure in the interior of the battery which can lead to destruction and fire can be identified.

In contrast to temperature sensors which are fitted externally on the battery housing and which monitor the temperature, a faulty reaction in the interior of the battery can be registered very early and an emergency shutdown can be carried out, for example, appropriately rapidly. If the battery overheats, therefore, an emergency shutdown can be actuated, for example.

By way of example, on the battery housing, a rupture sheet can be replaced by an optically transparent window through which characteristic variables in the interior of the battery can be monitored optically. By way of example, a spectroscopic detection of changes in the chemical composition (of the battery fluid or the electrolyte), an arising of pressure as a result of flexure of a membrane that specularly reflects the light and/or a change in the filling level can be identified.

In accordance with one aspect, it is possible to provide an optical sensor system for an electrochemical battery cell having (or consisting of) an optical window in the battery housing and also a light source and a light detector in a suitable housing. In this case, the light source and the detector can, for example, be fitted directly to the battery or be arranged at a certain distance using an optical waveguide or an optical fiber.

Light can be radiated in optically by a glass rod and a falling liquid level can be identified. This can also be effected by means of a prism and external irradiation. Optionally, the measurement can be effected in the interior and, if appropriate, an additional electrical bushing can be implemented. Alternatively, internal measurement can be effected and a bushing present (e.g., one of the two present) can be utilized (e.g., the signal can also be modeled, e.g., on DLAN, Defense Local Area Network). Optionally, a rupture plate bulge (e.g., distension) can also be measured by means of a sensor device. Alternatively, internal measurement can be effected and the sensor can be integrated into the aluminum battery cover. Alternatively, by way of example, the rupture sheet can be replaced by a sensor. Furthermore, optionally, a sensor plug housing can be realized wherein the plug can be realized as a sensor (e.g., plug through instead of rupture sheet or plug instead of closure ball or at the end of the hole from the battery cover). Alternatively, the sensor can also be incorporated in a voltage bushing since there may be enough space there (e.g., in the screw thread).

FIG. 11 shows a flow chart of a method 1100 for determining a state of a rechargeable battery or of a battery as one example embodiment. The method 1100 comprises bringing about an interaction 1110 between an optical signal and a part of the rechargeable battery or of the battery, which part indicates optically acquirable information about a state of the rechargeable battery or of the battery. Furthermore, the method 1100 comprises detecting 1120 an optical signal caused by the interaction, and determining 1130 information about a state of the rechargeable battery or of the battery on the basis of information about the detected optical signal.

The method 1100 can optionally comprise one or more additional steps corresponding to one or more aspects described in connection with the concept described or with one or more example embodiments.

The features disclosed in the description above, the following claims and the enclosed figures can be of importance and implemented both individually and in any desired combination for the realization of an example embodiment in its various configurations.

Although some aspects have been described in connection with an apparatus, it goes without saying that these aspects also represent a description of the corresponding method, such that a block or a component of an apparatus should also be understood as a corresponding method step or as a feature of a method step. Analogously to this, aspects described in connection with or as a method step also represent a description of a corresponding block or detail or feature of a corresponding apparatus.

Depending on specific implementation requirements, example embodiments of the disclosure can be implemented in hardware or in software. The implementation can be carried out using a digital storage medium, for example a floppy disk, a DVD, a Blu-ray disk, a CD, a ROM, a PROM, an EPROM, an EEPROM or a FLASH memory, a hard disk or some other magnetic or optical storage device on which are stored electronically readable control signals which can interact or interact with a programmable hardware component in such a way that the respective method is carried out.

A programmable hardware component can be formed by a processor, a central processing unit (CPU), a graphics processing unit (GPU), a computer, a computer system, an application-specific integrated circuit (ASIC), an integrated circuit (IC), a system on chip (SOC), a programmable logic element or a field programmable gate array with a microprocessor (FPGA).

The digital storage medium can therefore be machine- or computer-readable. Some example embodiments therefore comprise a data carrier having electronically readable control signals that are able to interact with a programmable computer system or a programmable hardware component in such a way that one of the methods described herein is carried out. One example embodiment, therefore, is a data carrier (or a digital storage medium or a computer-readable medium) on which the program for carrying out one of the methods described herein is recorded.

Generally, example embodiments of the present disclosure can be implemented as a program, firmware, computer program or computer program product comprising a program code or as data, wherein the program code or the data is or are operative to the effect of carrying out one of the methods if the program runs on a processor or a programmable hardware component. The program code or the data can for example also be stored on a machine-readable carrier or data carrier. The program code or the data can be present inter alia as source code, machine code or byte code and as other intermediate code.

A further example embodiment is furthermore a data stream, a signal train or a sequence of signals which represents or represent the program for carrying out one of the methods described herein. The data stream, the signal train or the sequence of signals can be configured for example to the effect of being transferred via a data communication connection, for example, via the internet or some other network. Example embodiments thus also include data-representing signal trains that are suitable for sending via a network or a data communication connection, wherein the data represent the program.

A program in accordance with one example embodiment can implement one of the methods while it is being carried out for example by reading memory locations or writing a datum or a plurality of data thereto, as a result of which, if appropriate, switching processes or other processes are brought about in transistor structures, in amplifier structures or in other electrical components, optical components, magnetic components or components that operate according to some other functional principle. Accordingly, by means of a memory location being read, data, values, sensor values or other information can be acquired, determined or measured by a program. Therefore, by means of reading one or more memory locations, a program can acquire, determine or measure variables, values, measurement variables and other information and, by means of writing to one or more memory locations, a program can bring about, instigate or carry out an action and drive other devices, machines and components.

The example embodiments described above merely constitute an illustration of the principles of the present disclosure. It goes without saying that modifications and variations of the arrangements and details described herein will become apparent to other persons skilled in the art. Therefore, the intention is for the disclosure to be restricted only by the scope of protection of the following patent claims, and not by the specific details presented herein on the basis of the description and the explanation of the example embodiments.

The invention claimed is:

1. An apparatus for determining a state of a rechargeable battery or a battery, comprising:
    a sensor device, which is designed to orient an optical signal to interact with a part of the rechargeable battery or of the battery, which part indicates optically acquirable information about a state of the rechargeable battery or of the battery, and to detect a response optical signal caused by the interaction, wherein the sensor device is designed to provide a detection signal having information about the detected response optical signal; and
    an evaluation device, which is designed to determine information about a state of the rechargeable battery or of the battery on the basis of the information of the detection signal, wherein the evaluation device is designed to provide a state signal having the information about the determined state,
    wherein the interaction of the optical signal with the part of the rechargeable battery or of the battery results in the response optical signal being a complete reflection or a wavelength-dependent absorption of parts of the optical signal, or results in the response optical signal being an excitation response wherein the response optical signal is a luminescence radiation.

2. The apparatus as claimed in claim 1, wherein the sensor device has a light source for infrared or visible light, which is designed to generate the optical signal.

3. The apparatus as claimed in claim 1, wherein the sensor device has an optical detector unit, which is designed to detect the optical signal caused by the interaction and to provide the detection signal.

4. The apparatus as claimed in claim 1, which furthermore has an optical fiber, wherein the optical fiber is connected to the sensor device and is connectable to the rechargeable battery or the battery, such that the optical signal is guidable via the optical fiber to the state-indicating part of the rechargeable battery or of the battery and the optical signal caused by the interaction is guidable via the optical fiber to the sensor device.

5. The apparatus as claimed in claim 1, which has a plurality of sensor devices for a plurality of rechargeable batteries or batteries, wherein the evaluation device is designed to receive detection signals from each sensor device of the plurality of sensor devices and to determine a state of the corresponding rechargeable battery or of the corresponding battery on the basis of the respective detection signal.

* * * * *